(12) United States Patent
Kim

(10) Patent No.: US 6,503,802 B2
(45) Date of Patent: Jan. 7, 2003

(54) METHOD OF FABRICATING ISOLATION STRUCTURE FOR SEMICONDUCTOR DEVICE

(75) Inventor: Eung-Su Kim, Cheongju (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/995,679

(22) Filed: Nov. 29, 2001

(65) Prior Publication Data

US 2002/0076920 A1 Jun. 20, 2002

(30) Foreign Application Priority Data

Nov. 30, 2000 (KR) .......................... 2000-72066

(51) Int. Cl.[7] ............................................ H01L 21/336
(52) U.S. Cl. ........................................ 438/294; 438/353
(58) Field of Search ................................. 438/294, 296, 438/297, 353, 359, 362, 404, 424, 480, 221, 391, 637, 680, 700, 770

(56) References Cited

U.S. PATENT DOCUMENTS 6,093,618 A * 7/2000 Chen et al. .................. 438/400
6,156,620 A * 12/2000 Punchner et al. ........... 438/400
6,333,232 B1 * 12/2001 Kunikiyo ..................... 438/296

* cited by examiner

Primary Examiner—David Nelms
Assistant Examiner—David Nhu
(74) Attorney, Agent, or Firm—Birch, Stewart, Kolasch & Birch, LLP

(57) ABSTRACT

A method of fabricating an isolation structure for a semiconductor device is provided. The method includes the steps of forming a trench in a semiconductor substrate, implanting oxidation-accelerating ions into corner portions of the semiconductor substrate, forming an oxide film in the trench of the semiconductor substrate, which activates the oxidation-accelerating ions to round the corner portions of the semiconductor substrate, and filling the trench with an insulating material to fabricate the isolation structure.

16 Claims, 4 Drawing Sheets

METHOD OF FABRICATING ISOLATION STRUCTURE FOR SEMICONDUCTOR DEVICE

BACKGROUND OF THE INVENTION

1. Field of the Invention

The present invention relates to a fabrication method for a semiconductor device, and more particularly, to a method of fabricating an isolation structure for a semiconductor device.

2. Description of the Background Art

Isolation structures are used in semiconductor devices to isolate electrically different components of the semiconductor devices. Once the components are isolated from each other, certain electrical paths can be established between the components to obtain desired electrical characteristics from the semiconductor device.

Conventional methods for fabricating an isolation structure for a semiconductor device typically employ a LOCal Oxidation of Silicon (LOCOS) process. In the LOCOS process, a field oxide is thermally grown by using an oxidation mask to pattern the growth. However, a portion of the field oxide grows laterally, thereby producing tapering oxide wedge portions outside the desired growth pattern. These oxide wedge portions are referred to as a "bird's beak" due to the shape of the wedge portions. The bird's beak reduces the isolation area between the components of the semiconductor device and can deteriorate the electrical performance of the semiconductor device.

To overcome this problem, a shallow trench isolation (STI) structure or profiled groove isolation (PGI) structure has been developed as an isolation structure. In the STI or PGI, a trench or groove is formed in a semiconductor substrate and filled with insulating materials to provide the isolation feature. Most of conventional Dynamic Random Access Memory (DRAM) devices are fabricated by employing such an STI or PGI structure.

A conventional method of fabricating an STI structure is described below with reference to FIGS. 1A through 1F. First, as illustrated in FIG. 1A, a pad oxide film 101 and a nitride film 102 are sequentially formed on the top surface of a semiconductor substrate 100. Then, as illustrated in FIG. 1B, a photoresist pattern 103 is formed on the top surface of the nitride film 102. Then the nitride film 102 and the pad oxide film 101 are sequentially etched by using the photoresist pattern 103 as a mask to expose a certain portion of the top surface of the semiconductor substrate 100.

As illustrated in FIG. 1C, the exposed portion of the semiconductor substrate 100 is then etched to form a trench 104 in the semiconductor substrate 100. The photoresist pattern 103 is then removed completely from the nitride film 102 and the remaining structure is cleaned. Thereafter, as illustrated in FIG. 1D, an oxide film 105 is formed on the exposed surface of the semiconductor substrate 100 at the inner walls and bottom surface of the trench 104.

Next, as illustrated in FIG. 1E, an other oxide film 106 is formed in the trench 104 and on the exposed surfaces of the nitride film 102. Then, as illustrated in FIG. 1F, the surface of the semiconductor substrate 100 is planarized by removing the entire pad oxide film 101, the entire nitride film 102 and the portion of the oxide film 106 above the semiconductor substrate 100. Here, a conventional chemical mechanical polishing process can be used to planarize the semiconductor substrate 100. This produces a conventional STI structure 110, and the fabrication method is completed.

Although effective, there is, however, a limitation associated with the STI structure 110. The corners C of the top surface of the semiconductor substrate 100 at the entrance of the trench 104 have pointed edges. In some cases, the cleaning step and the oxide film formation step of FIGS. 1C and 1D may smooth these edges slightly, but the resultant corners C would still have pointed edges. The shape of the pointed edges causes electric fields to be concentrated at the corners C of the semiconductor substrate. The concentration of electric fields at the corners C causes a well-known "hump" phenomenon that degrades the electrical characteristics and performance of the semiconductor device having the STI structure 110.

SUMMARY OF THE INVENTION

Accordingly, it is an object of the present invention to provide a method of fabricating an isolation structure for a semiconductor substrate which overcomes the above-described and other problems associated with conventional fabrication methods.

It is another object of the present invention to provide a method of fabricating an isolation structure for a semiconductor device in which the reliability and performance of the semiconductor device can be improved by stabilizing the electrical characteristics of the semiconductor device.

It is another object of the present invention to provide a method of fabricating an isolation structure for a semiconductor device in which the occurrence of a hump. phenomenon can be prevented by reducing significantly the sharpness at the corner of a semiconductor substrate.

To achieve the above and other objects, the present provides a method of fabricating an isolation structure for a semiconductor device, including the steps of forming a trench in a semiconductor substrate, implanting oxidation-accelerating ions into corner portions of the semiconductor substrate, forming an oxide film in the trench of the semiconductor substrate, which activates the oxidation-accelerating ions to round the corner portions of the semiconductor substrate, and filling the trench with an insulating material to fabricate the isolation structure.

The present invention is also directed to a method of fabricating an isolation structure for a semiconductor device. The method includes the steps of providing a trench in a semiconductor substrate, implanting oxidation-accelerating ions into corner portions of the semiconductor substrate, annealing the semiconductor substrate to activate the oxidation-accelerating ions, thereby rounding the corner portions of the semiconductor substrate, and filling the trench with an insulating material to fabricate the isolation structure.

The present invention is further directed to a method of fabricating an isolation structure for a semiconductor device, the method comprising the steps of: providing a trench in a semiconductor substrate; selectively accelerating oxidation speed at corner portions of the semiconductor substrate by forming an oxide film in the trench, and thereby rounding the corner portions of the semiconductor substrate; and filling the trench with an insulating material to fabricate the isolation structure.

Additional advantages, objects and features of the invention will become more apparent from the description which follows.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The preferred embodiment of the present invention will now be described with reference to the accompanying drawings. FIGS. 2A–2G illustrate the processing steps of a method for fabricating an isolation structure for a semiconductor device according to one embodiment of the present invention.

Figure 1A:
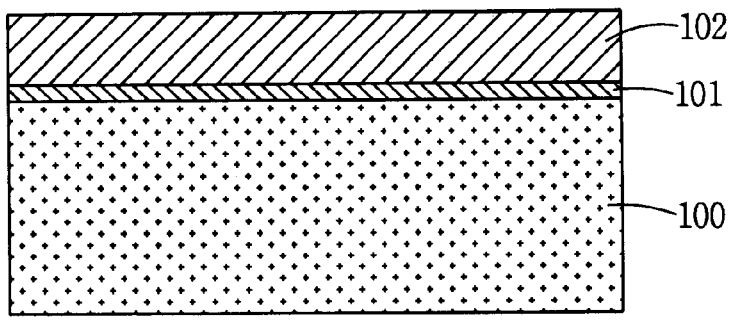
FIGS. 1A through 1F are cross-sectional views for explaining the processing steps of a conventional method for fabricating an isolation structure for a semiconductor device.
Figure 1B:
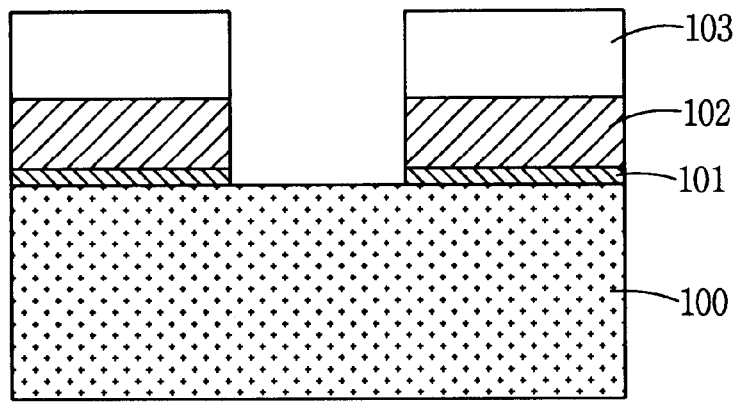
Figure 1C:
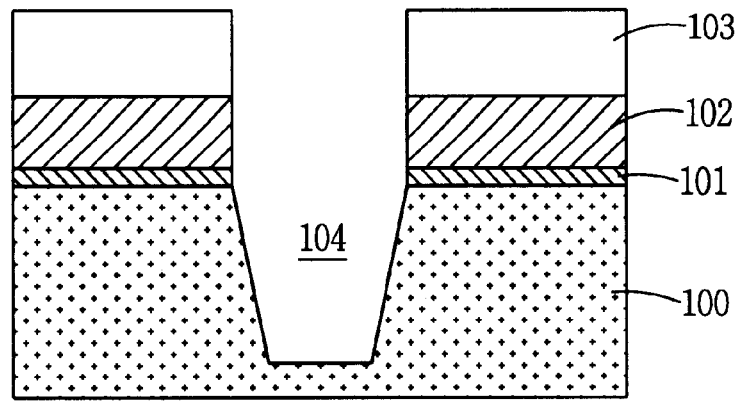
Figure 1D:
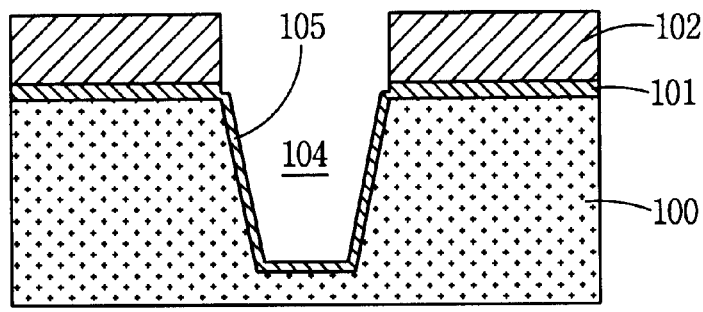
Figure 1E:
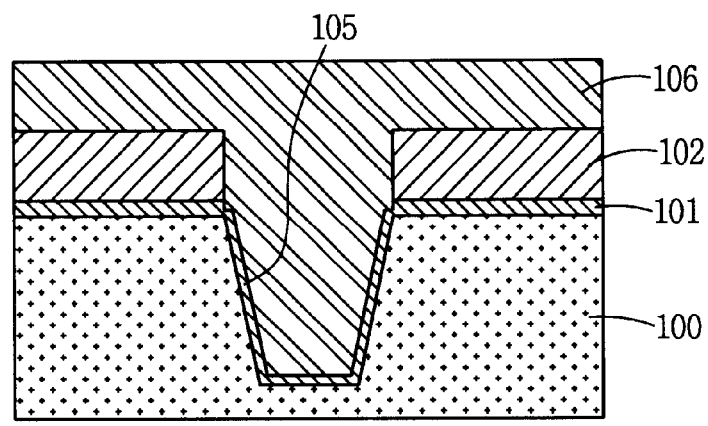
Figure 1F:
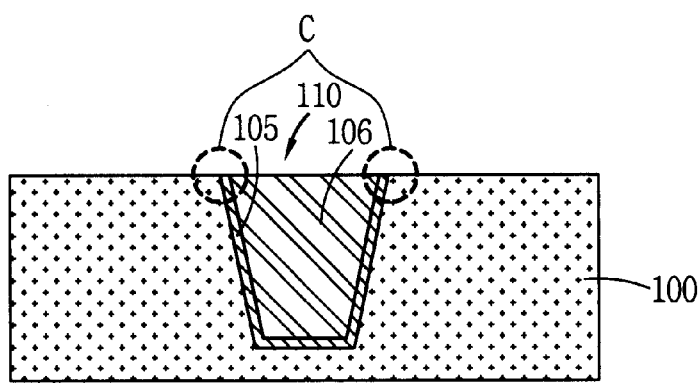
Figure 2A:
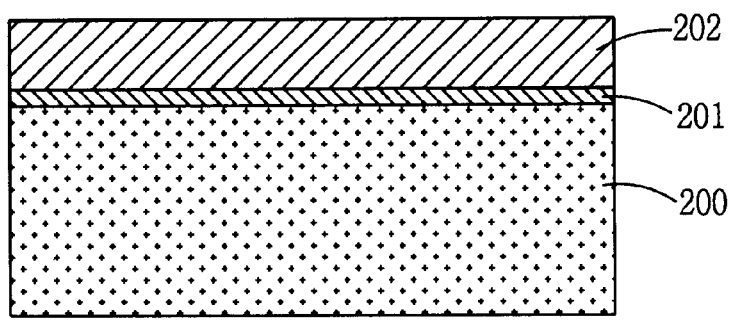
FIGS. 2A through 2G are views for explaining the processing steps of a method for fabricating an isolation structure for a semiconductor device according to one embodiment of the present invention.

In this method, as illustrated in FIG. 2A, a pad oxide film 201 is formed on a semiconductor substrate 200. This can be accomplished by oxidizing a silicon substrate using a thermal oxidation process, a chemical vapor deposition process, or other existing techniques. Then, a silicon nitride film 202 is formed on the pad oxide film 201 using any existing technique.

Figure 2B:
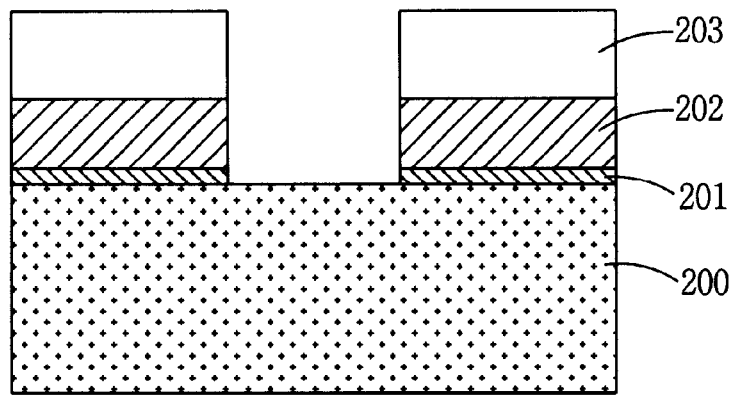

Then, as illustrated in FIG. 2B, a photoresist pattern 203 is formed on the top surface of the silicon nitride film 202. Then the silicon nitride film 202 and the pad oxide film 201 are selectively removed by using the photoresist pattern 203 as a mask and a known etching or other removal process. This exposes a portion of the top surface of the semiconductor substrate 200 which corresponds to a device isolation region.

Figure 2C:
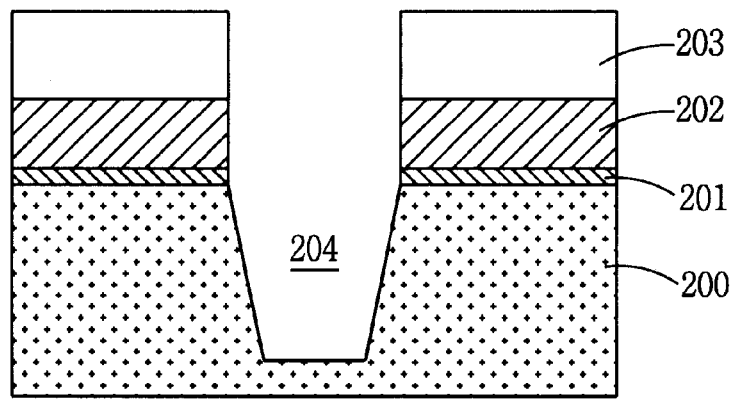
Figure 2D:
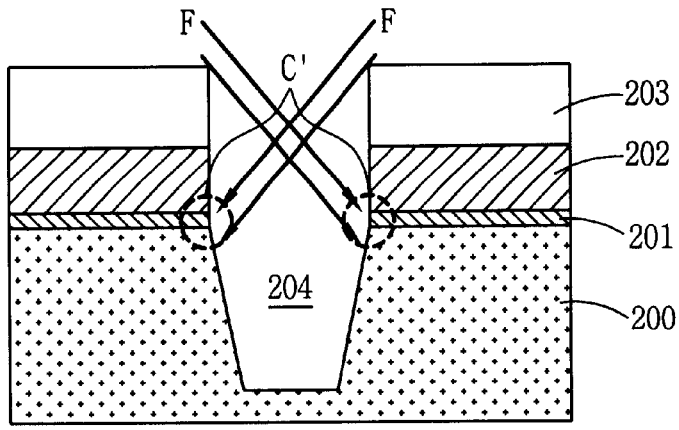

Then, as illustrated in FIG. 2C, the exposed portion of the semiconductor substrate 200 is selectively removed to form a trench 204 in the semiconductor substrate 200. This step can be accomplished using any existing etching technique. Then, as illustrated in FIG. 2D, oxidation-accelerating ions, such as fluoride ions, are implanted into the corner portions C' of the semiconductor substrate 200. This can be accomplished by using an inclined ion implantation process or other ion implantation process. Then the photoresist pattern 203 is removed from the silicon nitride film 202. In another embodiment, the silicon nitride film 202 may be removed prior to performing the ion-implantation process.

Figure 2E:
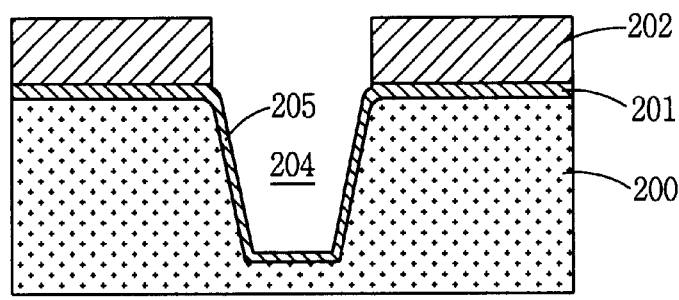

Then, as illustrated in FIG. 2E, a thermal oxide film 205, also known as a "sacrificial oxide film", is formed in the trench 204 and on the exposed surfaces of the pad oxide film 201. This can be accomplished by annealing the semiconductor substrate 200, preferably at 1050° C. under the $O_2$ atmosphere. In a preferred embodiment, the thermal oxide film 205 has a thickness of about 50–200 Å. During the annealing process, since the oxidation speed at the corner portions C' of the semiconductor substrate 200 is much higher than the oxidation speed at other surfaces of the semiconductor substrate 200 due to the implanted oxidation-accelerating ions, the pointed edges at the corner portions C' of the semiconductor substrate 200 are rounded automatically as the thermal oxide film 205 is formed.

Figure 2F:
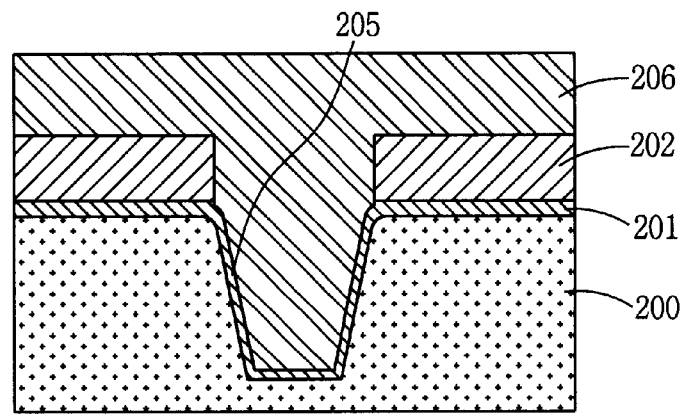

Next, as illustrated in FIG. 2F, an insulating film 206 is formed in the trench 204 and on the exposed surfaces of the silicon nitride film 202, e.g., by using a chemical vapor deposition (CVD) process. The insulating film 206 is preferably formed as a silicon oxide film.

Figure 2G:
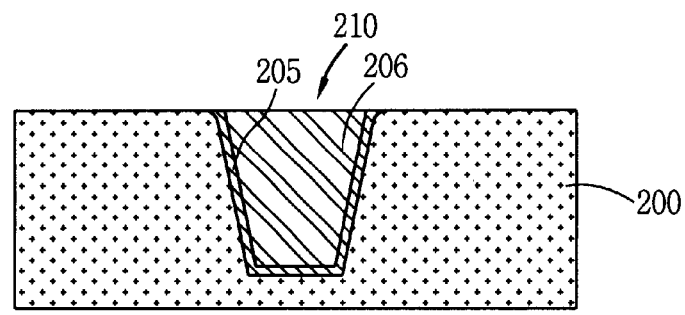

Then, as illustrated in FIG. 2G, the surface of the semiconductor substrate 200 is planarized by removing the entire pad oxide film 201, the entire nitride film 202, and the portion of the silicon oxide film 206 above the semiconductor substrate 200. This exposes the top surface of the semiconductor substrate 200 and produces an isolation structure 210 for use in a semiconductor device. The planarizing step can be accomplished by using existing techniques such as a chemical mechanical polishing process. This completes the processing steps for the method of fabricating the isolation structure for a semiconductor device.

According to the present invention, the oxidation speed of the corner portions C' of the semiconductor substrate at the entrance of the trench is increased during the formation of the sacrificial oxide film, because the corner portions C' of the semiconductor substrate have been implanted with oxidation-accelerating ions such as fluoride ions. The increased oxidation speed produces rounded corner portions of the semiconductor substrate near the trench entrance. Having rounded corners at the semiconductor substrate is important because it stabilizes and improves the electrical characteristics and performance of the semiconductor device by preventing or eliminating concentration of electric fields at the corner portions of the semiconductor substrate at the trench entrance. Therefore, the present invention is advantageous over the conventional methods of forming isolation structures for semiconductor devices As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method of fabricating an isolation structure for a semiconductor device, comprising the steps of:

forming a trench on a semiconductor substrate;

implanting oxidation-accelerating ions only into top corner portions of the semiconductor substrate at an entrance of the trench;

forming an oxide film in the trench of the semiconductor substrate, which activates the oxidation-accelerating ions to round the corner portions of the semiconductor substrate; and filling the trench with an insulating material to fabricate the isolation structure.

2. The method of claim 1, wherein the step of forming the oxide film includes the step of:

annealing the semiconductor substrate and thereby activating the oxidation-accelerating ions in the corner portions of the semiconductor substrate.

3. The method of claim 2, wherein the annealing step is performed at around 1050° C. under an $O_2$ atmosphere.

4. The method of claim 1, wherein the step of filling the trench includes the steps of:

depositing the insulating material in the trench and on exposed surfaces of the semiconductor substrate; and chemically and mechanically polishing the insulating material to planarize the semiconductor substrate.

5. The method according to claim 4, wherein the step of depositing the insulating material is performed using a chemical vapor deposition process.

6. The method of claim 1, wherein the step of forming the trench includes the steps of:

forming a pad oxide film on the semiconductor substrate;

forming a silicon nitride film on the pad oxide film;

forming a photoresist pattern on the silicon nitride film;

selectively removing the silicon nitride film and the pad oxide film using the photoresist pattern as a mask to expose a portion of the semiconductor substrate; and selectively removing a part of the exposed portion of the semiconductor substrate to form the trench.

7. The method of claim 1, wherein the oxidation-acceleration ions include fluoride ions.

8. The method of claim 1, wherein the implanting step is performed using an inclined ion implantation process.

9. A method of fabricating an isolation structure for a semiconductor device, the method comprising the steps of:

providing a trench in a semiconductor substrate;

implanting oxidation-accelerating ions only into top corner portions of the semiconductor substrate at an entrance of the trench;

annealing the semiconductor substrate to activate the oxidation-accelerating ions, thereby rounding the corner portions of the semiconductor substrate; and filling the trench with an insulating material to fabricate the isolation structure.

10. The method of claim 9, wherein the annealing step also forms an oxide film in the trench of the semiconductor substrate.

11. The method of claim 9, wherein the annealing step is performed at around 1050° C. under an $O_2$ atmosphere.

12. The method of claim 9, wherein the oxidation-acceleration ions include fluoride ions.

13. The method of claim 9, wherein the implanting step is performed using an inclined ion implantation process.

14. The method according to claim 9, wherein the step of filling the trench includes the steps of:

depositing the insulating material in the trench and on the exposed surfaces of the semiconductor substrate; and planarizing the semiconductor substrate.

15. The method of claim 14, wherein the step of depositing the insulating material is performed using a chemical vapor deposition process.

16. The method of claim 9, wherein the step of providing the trench includes the steps of forming a pad oxide film on the semiconductor substrate;

forming a silicon nitride film on the pad oxide film;

forming a photoresist pattern on the silicon nitride film;

selectively removing the silicon nitride film and the pad oxide film using the photoresist pattern as a mask to expose a portion of the semiconductor substrate; and selectively removing a part of the exposed portion of the semiconductor substrate to form the trench.

\* \* \* \* \*